US008475666B2

(12) United States Patent
Ramos et al.

(10) Patent No.: US 8,475,666 B2
(45) Date of Patent: *Jul. 2, 2013

(54) METHOD FOR MAKING TOUGHENING AGENT MATERIALS

(75) Inventors: Teresa A. Ramos, San Jose, CA (US);
Robert R. Roth, Sunnyvale, CA (US);
Anil S. Bhanap, Milpitas, CA (US);
Paul G. Apen, San Francisco, CA (US);
Denis H. Endisch, Cupertino, CA (US);
Brian J. Daniels, La Honda, CA (US);
Ananth Naman, San Jose, CA (US);
Nancy Iwamoto, Ramona, CA (US);
Roger Y. Leung, San Jose, CA (US)

(73) Assignee: Honeywell International Inc., Morristown, NJ (US)

( * ) Notice: Subject to any disclaimer, the term of this patent is extended or adjusted under 35 U.S.C. 154(b) by 1931 days.

This patent is subject to a terminal disclaimer.

(21) Appl. No.: 10/940,686

(22) Filed: Sep. 15, 2004

(65) Prior Publication Data

US 2006/0057855 A1 Mar. 16, 2006

(51) Int. Cl.
*H01L 21/30* (2006.01)

(52) U.S. Cl.
USPC .......... 216/13; 216/19; 216/79; 216/83; 216/99; 134/1.2; 134/1.3; 438/694; 438/700; 438/723; 438/725; 438/745; 438/756; 438/778; 438/787; 438/800; 438/906; 427/585; 427/97.4; 427/98.5; 252/79.1; 252/182.11; 252/182.34

(58) Field of Classification Search
USPC 438/594, 624, 700, 702, 704; 252/79.1–79.5; 430/316, 326
See application file for complete search history.

(56) References Cited

U.S. PATENT DOCUMENTS

| 4,043,969 | A | * | 8/1977 | Sporck | 523/213 |
| 4,567,221 | A | | 1/1986 | Maruyama et al. | |
| 4,624,739 | A | | 11/1986 | Nixon et al. | |
| 4,626,961 | A | * | 12/1986 | Ono et al. | 361/751 |
| 4,654,269 | A | | 3/1987 | Lehrer | 428/428 |
| 5,079,300 | A | | 1/1992 | Dubrow et al. | 525/106 |
| 5,271,777 | A | | 12/1993 | Duffy | |
| 5,372,851 | A | | 12/1994 | Ogawa et al. | |
| 5,429,730 | A | | 7/1995 | Nakamura et al. | 204/192.34 |
| 5,479,727 | A | | 1/1996 | Fine et al. | |
| 5,488,015 | A | | 1/1996 | Havemann et al. | |
| 5,576,247 | A | | 11/1996 | Yano et al. | |
| 5,609,629 | A | | 3/1997 | Fearnot et al. | |
| 5,686,549 | A | | 11/1997 | Grainger et al. | 428/25 |
| 5,709,715 | A | | 1/1998 | Guidotti et al. | |
| 5,723,909 | A | | 3/1998 | Yano et al. | |
| 5,747,880 | A | | 5/1998 | Havemann et al. | |
| 5,750,610 | A | | 5/1998 | Burns et al. | 524/434 |
| 5,915,175 | A | | 6/1999 | Wise | 438/238 |
| 5,950,101 | A | | 9/1999 | Yano et al. | |
| 6,037,275 | A | * | 3/2000 | Wu et al. | 438/780 |
| 6,042,994 | A | | 3/2000 | Yang et al. | 430/296 |
| 6,059,553 | A | | 5/2000 | Jin et al. | |
| 6,090,724 | A | | 7/2000 | Shelton et al. | |
| 6,096,070 | A | | 8/2000 | Ragheb et al. | |
| 6,177,143 | B1 | | 1/2001 | Treadwell et al. | |
| 6,208,014 | B1 | | 3/2001 | Wu et al. | |
| 6,255,230 | B1 | | 7/2001 | Ikakura et al. | |
| 6,258,972 | B1 | | 7/2001 | Nakaoka et al. | 556/482 |
| 6,318,124 | B1 | | 11/2001 | Rutherford et al. | 65/60.8 |
| 6,346,490 | B1 | | 2/2002 | Catabay et al. | 438/795 |
| 6,395,650 | B1 | * | 5/2002 | Callegari et al. | 438/785 |
| 6,395,651 | B1 | | 5/2002 | Smith et al. | |
| 6,410,149 | B1 | | 6/2002 | Hendricks et al. | |
| 6,420,193 | B1 | | 7/2002 | Martin | 438/4 |
| 6,441,489 | B1 | | 8/2002 | Motoyama | |
| 6,448,331 | B1 | | 9/2002 | Ioka et al. | |
| 6,451,512 | B1 | | 9/2002 | Rangarajan | 430/313 |
| 6,479,374 | B1 | * | 11/2002 | Ioka et al. | 438/601 |
| 6,495,906 | B2 | | 12/2002 | Smith et al. | 257/629 |
| 6,508,920 | B1 | | 1/2003 | Ritzdorf et al. | 204/194 |
| 6,518,205 | B1 | | 2/2003 | Wu et al. | 438/782 |
| 6,521,547 | B1 | | 2/2003 | Chang et al. | 438/781 |
| 6,531,755 | B1 | | 3/2003 | Usami | |
| 6,537,919 | B1 | | 3/2003 | Wang | 438/710 |
| 6,566,283 | B1 | | 5/2003 | Pangrle et al. | |
| 6,573,147 | B2 | | 6/2003 | Moon et al. | 438/348 |
| 6,583,067 | B2 | | 6/2003 | Chang et al. | 438/723 |
| 6,589,889 | B2 | | 7/2003 | Endisch et al. | 438/780 |
| 6,607,925 | B1 | | 8/2003 | Kim et al. | 438/4 |
| 6,713,382 | B1 | | 3/2004 | Pangrle et al. | |
| 6,743,737 | B2 | | 6/2004 | Yau et al. | 438/758 |
| 6,762,066 | B2 | | 7/2004 | Holz | 438/4 |
| 6,770,572 | B1 | | 8/2004 | Wu et al. | |
| 6,821,880 | B1 | | 11/2004 | Tao et al. | 438/618 |
| 7,029,826 | B2 | * | 4/2006 | Hacker et al. | 430/311 |
| 7,119,052 | B2 | | 10/2006 | Korzenski et al. | |
| 7,122,481 | B2 | * | 10/2006 | Kloster et al. | 438/725 |
| 7,153,783 | B2 | * | 12/2006 | Lu et al. | 438/758 |
| 7,176,144 | B1 | * | 2/2007 | Wang et al. | 438/759 |

(Continued)

FOREIGN PATENT DOCUMENTS

DE 10130824 A1 10/2002
EP 0849796 A2 6/1998

(Continued)

OTHER PUBLICATIONS

S.V. Nitta, et al., "Surface Modified Spin-On Xerogel Films as Interlayer Dielectrics", 1999 American Vacuum Society, pp. 205-212.

(Continued)

*Primary Examiner* — Anita Alanko

(57) ABSTRACT

A toughening agent composition for increasing the hydrophobicity of an organosilicate glass dielectric film when applied to said film. It includes a component capable of alkylating or arylating silanol moieties of the organosilicate glass dielectric film via silylation, and an activating agent selected from the group consisting of an amine, an onium compound and an alkali metal hydroxide.

26 Claims, No Drawings

U.S. PATENT DOCUMENTS

| | | | |
|---|---|---|---|
| 7,179,757 B2* | 2/2007 | RamachandraRao et al. | 438/780 |
| 7,381,441 B2 | 6/2008 | Leung et al. | |
| 7,500,397 B2 | 3/2009 | Weigel et al. | |
| 7,553,769 B2 | 6/2009 | Toma et al. | |
| 7,678,712 B2* | 3/2010 | Bhanap et al. | 438/787 |
| 7,709,371 B2* | 5/2010 | Bhanap et al. | 438/623 |
| 7,858,294 B2* | 12/2010 | Hacker et al. | 430/314 |
| 7,915,159 B2* | 3/2011 | Bhanap et al. | 438/623 |
| 7,915,181 B2* | 3/2011 | Fan et al. | 438/783 |
| 8,017,518 B2* | 9/2011 | Morinaga et al. | 438/637 |
| 2002/0001973 A1 | 1/2002 | Wu et al. | 438/780 |
| 2002/0086116 A1 | 7/2002 | Hauck et al. | |
| 2002/0168876 A1 | 11/2002 | Endisch et al. | |
| 2003/0003765 A1 | 1/2003 | Gibson et al. | |
| 2003/0008516 A1 | 1/2003 | Chang et al. | |
| 2003/0013211 A1 | 1/2003 | Hu et al. | 438/4 |
| 2003/0198895 A1 | 10/2003 | Toma et al. | 430/314 |
| 2004/0013858 A1* | 1/2004 | Hacker et al. | 428/195.1 |
| 2004/0072436 A1 | 4/2004 | RamachandraRao et al. | 438/692 |
| 2004/0079632 A1 | 4/2004 | Ahmad et al. | |
| 2004/0096593 A1 | 5/2004 | Lukas et al. | |
| 2004/0096672 A1 | 5/2004 | Lukas et al. | |
| 2004/0152296 A1 | 8/2004 | Matz et al. | 428/623 |
| 2004/0224095 A1 | 11/2004 | Miller | 427/402 |
| 2004/0224512 A1 | 11/2004 | Sato et al. | 438/689 |
| 2005/0017365 A1 | 1/2005 | RamachandraRao et al. | 257/758 |
| 2005/0032293 A1 | 2/2005 | Clark et al. | 438/222 |
| 2005/0077597 A1 | 4/2005 | Toma et al. | 257/629 |
| 2005/0079705 A1 | 4/2005 | Takeuchi | |
| 2005/0095840 A1 | 5/2005 | Bhanap et al. | 438/623 |
| 2005/0106384 A1 | 5/2005 | Sambasivan et al. | 428/337 |
| 2005/0106762 A1 | 5/2005 | Chakrapani et al. | |
| 2005/0158884 A1 | 7/2005 | Gaynor | 438/4 |
| 2005/0173803 A1 | 8/2005 | Lu et al. | 257/759 |
| 2005/0215072 A1 | 9/2005 | Kevwitch et al. | 438/778 |
| 2005/0229947 A1 | 10/2005 | Spiegelman et al. | 134/2 |
| 2005/0233583 A1 | 10/2005 | Miyajima | 438/672 |
| 2005/0282401 A1 | 12/2005 | Davis | 438/780 |
| 2006/0057837 A1 | 3/2006 | Bhanap et al. | |
| 2006/0057855 A1 | 3/2006 | Ramos et al. | |
| 2006/0078827 A1* | 4/2006 | Hacker et al. | 430/311 |
| 2006/0141641 A1 | 6/2006 | Fan et al. | |
| 2007/0054501 A1* | 3/2007 | Carman et al. | 438/781 |
| 2011/0244680 A1* | 10/2011 | Tohnoe et al. | 438/677 |

FOREIGN PATENT DOCUMENTS

| | | |
|---|---|---|
| EP | 0775669 B1 | 5/2001 |
| EP | 0997497 B1 | 10/2004 |
| JP | H03-180033 A | 6/1991 |
| JP | H05-304089 A | 11/1993 |
| JP | 06-067408 | 3/1994 |
| JP | 7-335758 A | 12/1995 |
| JP | 9-106983 A | 4/1997 |
| JP | 9-237833 A | 9/1997 |
| JP | H10-270556 A | 10/1998 |
| JP | 2868243 B2 | 12/1998 |
| JP | 2000-277520 A | 10/2000 |
| JP | 2002-353308 A | 12/2002 |
| JP | 2003-142476 A | 5/2003 |
| KR | 2001-0001970 B1 | 4/2002 |
| RU | 2089499 C1 | 9/1997 |
| TW | 483099 | 4/2002 |
| TW | 495880 | 7/2002 |
| WO | WO 9738355 | 10/1997 |
| WO | WO 00/02233 | 1/2000 |
| WO | WO 00/44036 A | 7/2000 |
| WO | WO 02/01621 A | 1/2002 |
| WO | WO 0201621 | 1/2002 |
| WO | WO 03/077296 A | 9/2003 |
| WO | WO 2004068555 | 8/2004 |
| WO | WO 2005/010972 A | 2/2005 |
| WO | WO 2005/034194 A | 4/2005 |

OTHER PUBLICATIONS

"Fabrication of Moisture-Desensitized Freestanding Structures from InP for Photonic-MEMS Applications." Shah, Mithilesh A., et al. Journal of the Electrochemical Society, vol. 153, Issue 1, pp. G7-G11 (2006).

"Observation of intrusion rates of hexamethyldisilazane during supercritical carbon dioxide functionalization of triethoxyfluorosilane low-k films." Capani, P. M., et al., Materials Research Society Symposium Proceedings (2005), 863(Materials, Technology and Reliability of Advanced Interconnects—2005), pp. 177-182.

"Dielectric and Mechanical Properties of Surface Modified Organosilicate Films." Yu, Suzhu, et al., Journal of Sol-Gel Science and Technology (2005), 35(1), pp. 69-75.

"Repair of porous MSQ (p-MSQ) films using monochlorosilanes dissolved in supercritical $CO_2$." Xie, Bo, et al., Diffusion and Defect Data—Solid State Data, Pt. B: Solid State Phenomena (2005), 103-104(Ultra Clean Processing of Silicon Surfaces VII), pp. 323-326.

"Non-damaging cleaning processes for porous low-k materials." Clark, Philip G., et al. Advanced Metallization Conference 2004, Proceedings of the Conference, San Diego, (2005), 487-491. Publisher: Materials Research Society.

"The reaction of octyldimethylchlorosilane and supercritical $CO_2$ mixtures with porous methylsilsesquioxane thin films." Xie, Bo, et al., Advanced Metallization Conference 2004, Proceedings of the Conference, San Diego, (2005), 475-479. Publisher: Materials Research Society, Warrendale, Pa.

"Organic-Functionalized Pure-Silica-Zeolite MFI Low-k Films" Li, Shuang, et al. Chemistry of Materials (2005), 17(7), pp. 1851-1854.

"Repair of porous methylsilsesquioxane films using supercritical carbon dioxide." Xie, Bo, et al. Materials Research Society Symposium Proceedings (2004), 812 (Materials, Technology and Reliability for Advanced Interconnects and Low-k Dielectrics—2004), pp. 13-18.

"Rapid repair of plasma ash damage in low-k dielectrics using supercritical $CO_2$." Gorman, B. P., et al., Journal of Vacuum Science & Technology, B: Microelectronics and Nanometer Structures—Processing, Measurement, and Phenomena (2004), 22(3), pp. 1210-1212.

"Water removal and repair of porous ultra low-k films using supercritical $CO_2$." Xie, Bo, et al., Proceedings—Electrochemical Society (2004), 2003-26(Cleaning Technology in Semiconductor Device Manufacturing VIII), pp. 279-288.

"Backend Processing Using Supercritical $CO_2$." Muscat, Anthony. University of Arizona. May 15, 2003. NSF/SRC Engineering Research Center for Environmentally Benign Semiconductor Manufacturing.

"Cleaning and Restoring k Value of Porous MSQ Films." Clark, Philip G., et al., Semiconductor International, (2003), 26(9), 46-48,50,52.

"Supercritical Carbon Dioxide-based Fluids Used as a Recovery Tool for Low-k Materials." Orozco-Teran, Rosa A., et al., Materials Research Society Symp. Proc. vol. 766. 2003. p. 297-302.

"Effects of Supercritical Processing on Ultra Low-K Films." Reidy, R.F., et al., Materials Research Society Symp. Proc. vol. 766. 2003. p. 303-308.

"Eliminating dielectric degradation of low-k organosilicate glass by trimethylchlorosilane treatment." Chang, T. C., et al., Journal of Vacuum Science & Technology, B: Microelectronics and Nanometer Structures (2002), 20(4), pp. 1561-1566.

"Effective repair to ultra-low-k dielectric material (k.apprx.2.0) by hexamethyldisilazane treatment." Mor, Y. S., et al., Journal of Vacuum Science & Technology, B: Microelectronics and Nanometer Structures (2002), 20(4), pp. 1334-1338.

"Recovering Dielectric Loss of Low Dielectric Constant Organic Siloxane during the Photoresist Removal Process." Chang, T. C., et al., Journal of the Electrochemical Society (2002), 149(8), pp. F81-F84.

Zielinski, E. M., et al., "Damascene Integration of Copper and Ultra-Low-k Xerogel for High Performance Interconnects", IEEE IEDM Tech. Digest, Dec. 1997, pp. 936-938 (1997).

P. Liu, et al., "Enhancing the Oxygen Plasma Resistance of Low-k Methylsilsesquioxane by H2 Plasma Treatment," Japanese Journal of Applied Physics, vol. 38, p. 3482-3486 (1999), Jun. 1999.

Q. Han, et al., "Enabling Low-k Material Integration Through Low-ion Plasma Dry Strip Processes," Micro Magazine, p. 51-63 (Oct. 1999).

Patent Abstracts of Japan, vol. 2003, No. 09, Sep. 3, 2003—& JP 2003 142476 A (Asahi Kasei Corp), May 16, 2003 Hexamethylcyclosilizane as agent par. 79 abstract.

Abell, T. et. al.: "Damage minimized plasma pore sealing of microporous low k dielectrics" Microelectronic Engineering, Elsevier Publishers Bv., Amsterdam, NL, vol. 76, No. 1-4, Oct. 2004, pp. 16-19, XP004565763, ISSN: 0167-9317, the whole document.

* cited by examiner

METHOD FOR MAKING TOUGHENING AGENT MATERIALS

BACKGROUND OF THE INVENTION

1. Field of the Invention

The Invention concerns a toughening agent composition for organosilicate glass dielectric films. More particularly, the invention pertains to a method for restoring hydrophobicity to the surfaces of organosilicate glass dielectric films which have been subjected to an etching or ashing treatment in such a way as to remove at least a portion of previously existing carbon containing moieties, resulting in a film having reduced hydrophobicity. These toughened films are used as insulating materials in the manufacture of semiconductor devices such as integrated circuits ("ICs"), in order to ensure low dielectric constant and stable dielectric properties in these films.

2. Description of the Related Art

As semiconductor devices scale to lower technology nodes, the requirement for lower and lower dielectric constant (k) has been identified to mitigate RC delay. Similarly, as feature sizes in integrated circuits are reduced, problems with power consumption and signal cross-talk have become increasingly difficult to resolve. To achieve lower k (2.6-3.0) in dense inorganic materials, carbon has been added to reduce the polarizability thus reducing k. To achieve ultra low k (<2.4) materials, porosity is added to the carbon-rich dense matrix. While the introduction of carbon and porosity have reduced k, new challenges during back end of the line processing have also been identified. Specifically during etching and ashing, reactive gases have been found to damage the carbon at the surface of dense materials. Porous low k's have even more catastrophic effects from reactive etch and ash gases due to diffusion through the film, which causes a greater extent of damage at the internal pore walls. Once the carbon has been damaged, the films rehydroxylate and hydrogen bond with water. Because water has a dielectric constant of 70, small amounts that are absorbed for dense materials and adsorbed for porous materials cause the dielectric constant to go up significantly. Also, porous materials tend to void after copper annealing due to the high tensile stress fields which will destroy device yields. None of these are acceptable and lead to unviable materials.

It is believed that the integration of low dielectric constant materials for interlevel dielectric (ILD) and intermetal dielectric (IMD) applications will help to solve these problems. While there have been previous efforts to apply low dielectric constant materials to integrated circuits, there remains a long-standing need in the art for further improvements in processing methods and in the optimization of both the dielectric and mechanical properties of such materials. Device scaling in future integrated circuits clearly requires the use of low dielectric constant materials as a part of the interconnect structure. Most candidates for low dielectric constant materials for use in sub-100 nm generation ICs are carbon containing $SiO_2$ films formed by either CVD or spin-on methods. During subsequent processing steps, such as plasma etching and photoresist removal using plasma or wet strip methods, significant damage occurs to these low-k materials, that causes fluorine addition and carbon depletion from the low-k material adjacent to the etched surface. In addition to a higher effective k, the resultant structures are susceptible to void formation, outgassing and blister formation. The voids in turn may cause an increase in leakage current at elevated voltages and reduction in breakdown voltage. The present invention describes a way to reduce the damage and resulting issues by treating the wafers with silylating agents after the damage is caused. The use of non-damaging ash chemistry, such as $H_2$/He has been reported to reduce carbon depletion and associated problems. In this regard, see I. Berry, A. Shiota, Q. Han, C. Waldfried, M. Sekiguchi, and O. Escorcia, Proceedings—Electrochemical Society, 22, 202 (2002); and A. Matsushita, N. Ohashi, K. Inukai, H. J. Shin, S. Sone, K. Sudou, K. Misawa, I. Matsumoto, and N. Kobayashi, Proceedings of IEEE International Interconnect Technology Conference, 2003, 147 (2003). Alternatively, post-ash treatments that replenish carbon have also been shown to restore hydrophobicity and lower the dielectric constant. Post-ashing treatments that replenish carbon have also been shown to restore hydrophobicity and lower dielectric constant. In this regard, see Y. S. Mor, T. C. Chang, P. T. Liu, T. M. Tsai, C. W. Chen, S. T. Yan, C. J. Chu, W. F. Wu, F. M. Pan, W. Lur; and S. M. Sze, Journal of Vacuum Science & Technology, B, 2 (4), 1334 (2002); and P. G. Clark, B. D. Schwab, and J. W. Butterbaugh, Semiconductor International, 26 (9), 46 (2003). An advantage of the later approach is that it allows the use of well-established etching and ashing processes. To this end, it would be desirable to repair damage caused to a porous SiCOH-based low-k material using a post-ash treatment.

One way to approach this challenge is to repair the damaged area on dense surfaces, or in the case of porous materials on the internal pore walls with a re-methylating compound called a toughening agent (TA). Toughening agents react with the damaged re-hydroxylated surfaces and re-alkylate or re-arylate them which in-turn restores the dielectric constant. The following reaction describes the an exemplary-re-methylation process: SiOH (damaged surface)+RxSi(OCOCH$_3$)y (TA) yields SiOSiRx (repaired surface)+(CH$_3$COOH)y (acetic acid). In the case of porous damaged internal pore wall surfaces, the re-methylation prevents void formation. Many times, the use of a toughening agent allows for conventional etch and ash processes to be utilized with low and ultra low dielectric constant materials. The treatment could result in replenishment of carbon to the low-k film, thereby restoring hydrophobicity and resistance to further damage during a wet cleaning operation. Additionally, it would be desirable if the repaired low-k material was found to be resistant to void formation, which generally occurs in untreated porous low-k inter-level dielectric regions during copper annealing processes. Silylating agents ("toughening agents") can methylate the surface of $SiO_2$ based materials. Contemplated exposure includes vapor exposure (with or without plasma), spin coating and supercritical $CO_2$. Normally, SiCOH based porous low-k materials are susceptible to void formation in ILD during Cu damascene processing. After a toughening agent treatment, the resulting structure is significantly more resistant to void formation. Without being bound to any specific theory or mechanism, it is believed that plasma damage causes carbon depletion in the dielectric, by replacing Si—CH$_3$ bonds with Si—OH bonds. In damaged porous dielectrics, the pore surface is now covered with Si—OH bonds. In the presence of tensile stress (such as after Cu annealing), adjacent Si—OH groups can condense, thus causing local densification. The evolving reaction products and the stretching of the molecules due to the new links formed, causes voids to occur near the center of the ILD space. Toughening agents prevent void formation by replacing most Si—OH bonds by Si—O—Si—Rx bonds, which avoid condensation reactions. Therefore void formation does not occur.

In addition, it is also known that existence of the SiO—SiR$_2$—OSi linkage (where the SiR$_2$ is one example of a toughening functionality within the matrix), that the modulus of the porous material should improve. Modulus retention and improvement is required for most porous materials to withstand imposed stresses. The toughening linkage studied, a dimethylsilyl linkage, clearly improves the modulus. If applied to weakened areas of the silicate, an improvement of the material to external stress is expected.

The toughening treatment performed after dielectric trench and via formation and etching and ashing steps repairs carbon depletion and damage to the low-k materials. By this means, voids are deterred and the later can withstand internal stresses caused by annealing treatments to the metal filling the trenches and vias.

The toughening treatment is conducted by exposing the wafer surface to the silylating agent in liquid or gas form for a period sufficient to complete the reaction with the damaged low-K region. Optionally, a high temperature bake can be performed to remove remaining solvent and excess toughening agent. Also, optionally, a wet cleaning operation can be performed immediately after the toughening agent application, or after the baking step, using a commercially available chemical compatible with the low-k dielectric. Additionally a dehydration bake may be performed before the toughening agent treatment, to increase effectiveness of the toughening agent treatment.

The effectiveness of the toughening agent treatment can be verified using unpatterned low-k dielectric films subjected to etching and ashing processing followed by the toughening agent treatment. A successful toughening agent treatment results in increased carbon concentration that can be measured by FTIR, EDX, or XPS techniques. Additionally, a water contact angle increase is seen, which demonstrates the hydrophobic nature of the post-treatment surface. The toughening agent treated film also shows a lower dielectric constant extracted from C—V measurements, compared to an etched/ashed film that is not treated with toughening agent. In patterned wafers, the effectiveness of the toughening agent treatment is demonstrated by reduction or elimination of voids in the low-k dielectric in narrow spaces between Cu trenches after a copper anneal treatment following electroplating of copper, and also by lower profile change in trenches or vias after exposure to reactive solvents.

It has been found that toughening agents are made by using silane based monomers with reactive leaving groups together with an activating agent selected from the group consisting of an amine, an onium compound and an alkali metal hydroxide.

SUMMARY OF THE INVENTION

The invention provides a toughening agent composition for increasing the hydrophobicity and/or increasing the mechanical strength properties of an organosilicate glass dielectric film when applied to said film, which comprises a component capable of alkylating or arylating silanol moieties of the organosilicate glass dielectric film via silylation, and an activating agent selected from the group consisting of an amine, an onium compound and an alkali metal hydroxide.

The invention also provides a method for deterring the formation of stress-induced voids in an organosilicate glass dielectric film on a substrate, which organosilicate glass dielectric film has been patterned to form vias and trenches therein, and which organosilicate glass dielectric film has been thereafter subjected to at least one treatment which removes at least a portion of previously existing carbon containing moieties and reduces hydrophobicity of said organosilicate glass dielectric film, and which vias and trenches have been thereafter filled with a metal, and which metal has then been thereafter subjected to an annealing treatment, the method comprising contacting the organosilicate glass dielectric film, after being subjected to at least one treatment which removes previously existing carbon containing moieties, but before said vias and trenches have been filled with a metal, with a toughening agent composition at a concentration and for a time period effective to restore at least some of the carbon containing moieties to the organosilicate glass dielectric film and increase the hydrophobicity of the organosilicate glass dielectric film wherein the toughening agent composition comprises a component capable of alkylating or arylating silanol moieties of the organosilicate glass dielectric film via silylation, and an activating agent selected from the group consisting of an amine, an onium compound and an alkali metal hydroxide.

The invention further provides a method for forming a microelectronic device which comprises:
a) applying an organosilicate glass dielectric film onto a substrate;
b) forming a pattern of vias and trenches in the organosilicate glass dielectric film, and subjecting the organosilicate glass dielectric film to at least one treatment which removes at least a portion of previously existing carbon containing moieties and reduces hydrophobicity of said organosilicate glass dielectric film;
c) contacting the organosilicate glass dielectric film with a toughening agent composition at a concentration and for a time period effective to increase the hydrophobicity of the organosilicate glass dielectric film, wherein the toughening agent composition comprises a component capable of alkylating or arylating silanol moieties of the organosilicate glass dielectric film via silylation, and an activating agent selected from the group consisting of an amine, an onium compound and an alkali metal hydroxide;
d) optionally baking at from about 80° C. to about 400° C. for about 10 seconds or more;
e) filling the vias and trenches with a metal; and
f) optionally subjecting the metal to an annealing treatment.

The invention still further provides a microelectronic device produced by a process comprising:
a) applying an organosilicate glass dielectric film onto a substrate;
b) forming a pattern of vias and trenches in the organosilicate glass dielectric film, and subjecting the organosilicate glass dielectric film to at least one treatment which removes at least a portion of previously existing carbon containing moieties and reduces hydrophobicity of said organosilicate glass dielectric film;
c) contacting the organosilicate glass dielectric film with a toughening agent composition at a concentration and for a time period effective to increase the hydrophobicity of the organosilicate glass dielectric film, wherein the toughening agent composition comprises a component capable of alkylating or arylating silanol moieties of the organosilicate glass dielectric film via silylation, and an activating agent selected from the group consisting of an amine, an onium compound and an alkali metal hydroxide;
d) optionally baking at from about 80° C. to about 400° C. for about 10 seconds or more;
e) filling the vias and trenches with a metal; and
f) optionally subjecting the metal to an annealing treatment.

DETAILED DESCRIPTION OF THE INVENTION

In the context of the present invention, dielectric materials having low dielectric constants, typically below 3 are especially desirable because they typically allow faster signal propagation, reduce capacitive effects and cross talk between conductor lines, and lower voltages to drive integrated circuits. This invention relates to both porous and non-porous dielectric materials. One material with a low dielectric constant is silica which can be applied as a foamed dielectric material. For the lowest possible dielectric values, air is introduced into silica dielectric materials. Air has a dielectric constant of 1, and when air is introduced into a silica dielectric material in the form of nanoporous or nanometer-scale pore structures, relatively low dielectric constants ("k") are achieved. It should be understood that unless the "$SiO_2$" functional group is specifically mentioned when the term "silica" is employed, the term "silica" as used herein, for example, with reference to porous and non-porous dielectric films, is intended to refer to dielectric films prepared by the inventive methods from an organic or inorganic glass base material, e.g., any suitable starting material containing one or more silicon-based dielectric precursors. It should also be understood that the use of singular terms herein is not intended to be so limited, but, where appropriate, also encompasses the plural, e.g., exemplary processes of the invention may be described as applying to and producing a "film" but it is intended that multiple films can be produced by the described, exemplified and claimed processes, as desired. The term, "film" as used herein with regard to silica dielectric materials is intended to encompass any other suitable form or shape in which such silica dielectric materials are optionally employed. Nanoporous silica is attractive because it employs similar precursors, including organic-substituted silanes, e.g., tetramethoxysilane ("TMOS") and/or tetraethoxysilane ("TEOS"), as are used for the currently employed spin-on-glasses ("SOG") and chemical vapor disposition ("CVD") silica $SiO_2$. As used herein, the terms "void" and "pore" mean a free volume in which a mass is replaced with a gas or where a vacuum is generated. The composition of the gas is generally not critical, and appropriate gases include relatively pure gases and mixtures thereof, including air. The nanoporous polymer may comprise a plurality of pores. Pores are typically spherical, but may alternatively or additionally have any suitable shape, including tubular, lamellar, discoidal, or other shapes. The pores may be uniformly or randomly dispersed within the porous polymer. It is also contemplated that the pores may have any appropriate diameter. It is further contemplated that at least some pores may connect with adjacent pores to create a structure with a significant amount of connected or "open" porosity.

Nanoporous silica films have previously been fabricated by a number of methods. Suitable silicon-based precursor compositions and methods for forming nanoporous silica dielectric films, are described, for example, by the following co-owned U.S. Pat. Nos. 6,048,804; 6,022,812; 6,410,149; 6,372,666; 6,509,259; 6,218,497; 6,143,855; 6,037,275; 6,042,994; 6,048,804; 6,090,448; 6,126,733; 6,140,254; 6,204,202; 6,208,041; 6,318,124 and 6,319,855 all incorporated herein by reference herein.

Other dielectric and low dielectric materials comprise inorganic-based compounds, such as the silicon-based disclosed in commonly assigned U.S. patent application Ser. No. 10/078,919 filed Feb. 19, 2002, which is now published as U.S. Pat. No. 7,011,889; (for example NANOGLASS® and HOSP® products commercially available from Honeywell International Inc.). The dielectric and low dielectric materials may be applied by spin coating the material on to the surface, dip coating, spray coating, chemical vapor deposition (CVD), rolling the material onto the surface, dripping the material on to the surface, and/or spreading the material onto the surface. Dielectrics useful for this invention include CVD deposited materials, such as carbon doped oxides for example, Black Diamond, commercially available from Applied Materials, Inc., Coral, commercially available from Novellus, Aurora, which is commercially available from ASM, and Orion, which is commercially available from Trikon.

As used herein, the phrases "spin-on material", "spin-on organic material", "spin-on composition" and "spin-on inorganic composition" may be used interchangeable and refer to those solutions and compositions that can be spun-on to a substrate or surface using the spin coating application process. Examples of silicon-based compounds comprise siloxane compounds, such as methylsiloxane, methylsilsesquioxane, phenylsiloxane, phenylsilsesquioxane, methylphenylsiloxane, methylphenylsilsesquioxane, silazane polymers, silicate polymers and mixtures thereof. A contemplated silazane polymer is perhydrosilazane, which has a "transparent" polymer backbone where chromophores can be attached. Spin-on-glass materials also includes siloxane polymers and block polymers, hydrogensiloxane polymers of the general formula $(H_{0-1.0}SiO_{1.5-2.0})_x$ and hydrogensilsesquioxane polymers, which have the formula $(HSiO_{1.5})_x$, where x is greater than about four. Also included are copolymers of hydrogensilsesquioxane and an alkoxyhydridosiloxane or hydroxyhydridosiloxane. Spin-on glass materials additionally include organohydridosiloxane polymers of the general formula $(H_{0-1.0}SiO_{1.5-2.0})_n(R_{0-1.0}SiO_{1.5-2.0})_m$, and organohydridosilsesquioxane polymers of the general formula $(HSiO_{1.5})_n(RSiO_{1.5})_m$, where m is greater than zero and the sum of n and m is greater than about four and R is alkyl or aryl. Some useful organohydridosiloxane polymers have the sum of n and m from about four to about 5000 where R is a $C_1$-$C_{20}$ alkyl group or a $C_6$-$C_{12}$ aryl group. The organohydridosiloxane and organohydridosilsesquioxane polymers are alternatively denoted spin-on-polymers. Some specific examples include alkylhydridosiloxanes, such as methylhydridosiloxanes, ethylhydridosiloxanes, propylhydridosiloxanes, t-butylhydridosiloxanes, phenylhydridosiloxanes; and alkylhydridosilsesquioxanes, such as methylhydridosilsesquioxanes, ethylhydridosilsesquioxanes, propylhydridosilsesquioxanes, t-butylhydridosilsequioxanes, phenylhydridosilsesquioxanes, and combinations thereof. Several of the contemplated spin-on materials are described in the following issued patents and pending applications, which are herein incorporated by reference in their entirety: U.S. Pat. Nos. 6,506,497; 6,365,765; 6,268,457; 6,177,199; 6,358,559; 6,218,020; 6,361,820; 6,218,497; 6,359,099; 6,143,855; 6,512,071; U.S. patent application Ser. No. 10/001,143 filed Nov. 10, 2001, which is now published as U.S. Pat. No. 6,824,879; PCT/US00/15772 filed Jun. 8, 2000, which is now published as WO 2000/077575, and PCT/US00/00523 filed Jan. 7, 1999, which is now published as WO 2000/041231.

Solutions of organohydridosiloxane and organosiloxane resins can be utilized for forming caged siloxane polymer films that are useful in the fabrication of a variety of electronic devices, micro-electronic devices, particularly semiconductor integrated circuits and various layered materials for electronic and semiconductor components, including hard mask layers, dielectric layers, etch stop layers and buried etch stop layers. These organohydridosiloxane resin layers are compatible with other materials that might be used for layered materials and devices, such as adamantane-based compounds, diamantane-based compounds, silicon-core compounds, organic dielectrics, and nanoporous dielectrics. Compounds that are considerably compatible with the organohydridosiloxane resin layers contemplated herein are disclosed in U.S. Pat. Nos. 6,214,746; 6,171,687; 6,172,128; 6,156,812, U.S. Application Ser. No. 60/350,187 filed Jan. 15, 2002; U.S. patent application Ser. No. 09/538,276, which is now published as U.S. Pat. No. 6,313,185; U.S. patent application Ser. No. 09/544,504, which is now published as U.S. Pat. No.

6,380,347; U.S. patent application Ser. No. 09/587,851, which is now published as U.S. Pat. No. 6,444,715; and U.S. 60/347,195 filed Jan. 8, 2002; PCT Application PCT/US01/32569 filed Oct. 18, 2001, which is now published as WO 2002/081546; and PCT Application PCT/US01/50812 filed Dec. 31, 2001, which is now published as WO/2002/051019; which are all incorporated herein by reference.

Suitable organohydridosiloxane resins utilized herein have the following general formulas:

$$[H-Si_{1.5}]_n[R-SiO_{1.5}]_m \qquad \text{Formula (1)}$$

$$[H_{0.5}-Si_{1.5-1.8}]_n[R_{0.5-1.0}-SiO_{1.5-1.8}]_m \qquad \text{Formula (2)}$$

$$[H_{0-1.0}-Si_{1.5}]_n[R-SiO_{1.5}]_m \qquad \text{Formula (3)}$$

$$[H-Si_{1.5}]_x[R-SiO_{1.5}]_y[SiO_2]_z \qquad \text{Formula (4)}$$

wherein:
the sum of n and m, or the sum or x, y and z is from about 8 to about 5000, and m or y is selected such that carbon containing constituents are present in either an amount of less than about 40 percent (Low Organic Content=LOSP) or in an amount greater than about 40 percent (High Organic Content=HOSP); R is selected from substituted and unsubstituted, normal and branched alkyls (methyl, ethyl, butyl, propyl, pentyl), alkenyl groups (vinyl, allyl, isopropenyl), cycloalkyls, cycloalkenyl groups, aryls (phenyl groups, benzyl groups, naphthalenyl groups, anthracenyl groups and phenanthrenyl groups), and mixtures thereof; and wherein the specific mole percent of carbon containing substituents is a function of the ratio of the amounts of starting materials. In some LOSP embodiments, particularly favorable results are obtained with the mole percent of carbon containing substituents being in the range of between about 15 mole percent to about 25 mole percent. In some HOSP embodiments, favorable results are obtained with the mole percent of carbon containing substituents are in the range of between about 55 mole percent to about 75 mole percent.

Nanoporous silica dielectric films with dielectric constants ranging from about 1.5 to about 4 can also be used as one of the layers. Nanoporous silica films are laid down as a silicon-based precursor, aged or condensed in the presence of water and heated sufficiently to remove substantially all of the porogen and to form voids in the film. The silicon-based precursor composition comprises monomers or prepolymers that have the formula: $R_x—Si-L_y$, wherein R is independently selected from alkyl groups, aryl groups, hydrogen and combinations thereof, L is an electronegative moiety, such as alkoxy, carboxy, amino, amido, halide, isocyanato and combinations thereof, x is an integer ranging from 0 to about 2, and y is an integer ranging from about 2 to about 4. Other nanoporous compounds and methods can be found in U.S. Pat. Nos. 6,171,687; 6,172,128; 6,214,746; 6,313,185; 6,380,347; and 6,380,270, which are incorporated herein in their entirety.

The phrases "cage structure", "cage molecule", and "cage compound" are intended to be used interchangeably and refer to a molecule having at least 10 atoms arranged such that at least one bridge covalently connects two or more atoms of a ring system. In other words, a cage structure, cage molecule or cage compound comprises a plurality of rings formed by covalently bound atoms, wherein the structure, molecule or compound defines a volume, such that a point located with the volume can not leave the volume without passing through the ring. The bridge and/or the ring system may comprise one or more heteroatoms, and may be aromatic, partially saturated, or unsaturated. Further contemplated cage structures include fullerenes, and crown ethers having at least one bridge. For example, an adamantane or diamantane is considered a cage structure, while a naphthalene compound or an aromatic spiro compound are not considered a cage structure under the scope of this definition, because a naphthalene compound or an aromatic spiro compound do not have one, or more than one bridge.

Contemplated cage compounds need not necessarily be limited to being comprised solely of carbon atoms, but may also include heteroatoms such as N, S, O, P, etc. Heteroatoms may advantageously introduce non-tetragonal bond angle configurations. With respect to substituents and derivatizations of contemplated cage compounds, it should be recognized that many substituents and derivatizations are appropriate. For example, where the cage compounds are relatively hydrophobic, hydrophilic substituents may be introduced to increase solubility in hydrophilic solvents, or vice versa. Alternatively, in cases where polarity is desired, polar side groups may be added to the cage compound. It is further contemplated that appropriate substituents may also include thermolabile groups, nucleophilic and electrophilic groups. It should also be appreciated that functional groups may be utilized in the cage compound (e.g., to facilitate crosslinking reactions, derivatization reactions, etc.)

Cage molecules or compounds, as described in detail herein, can also be groups that are attached to a polymer backbone, and therefore, can form nanoporous materials where the cage compound forms one type of void (intramolecular) and where the crosslinking of at least one part of the backbone with itself or another backbone can form another type of void (intermolecular). Additional cage molecules, cage compounds and variations of these molecules and compounds are described in detail in PCT/US01/32569 filed on Oct. 18, 2001, which is incorporated by reference herein in its entirety and which is now published as WO 2002/081546. Contemplated polymers may also comprise a wide range of functional or structural moieties, including aromatic systems, and halogenated groups. Furthermore, appropriate polymers may have many configurations, including a homopolymer, and a heteropolymer. Moreover, alternative polymers may have various forms, such as linear, branched, super-branched, or three-dimensional. The molecular weight of contemplated polymers spans a wide range, typically between 400 Dalton and 400000 Dalton or more. Additives can also be used to enhance or impart particular properties, as is conventionally known in the polymer art, including stabilizers, flame retardants, pigments, plasticizers, surfactants, and the like. Compatible or non-compatible polymers can be blended in to give a desired property. Adhesion promoters can also be used. Such promoters are typified by hexamethyldisilazane, which can be used to interact with available hydroxyl functionality that may be present on a surface, such as silicon dioxide, that was exposed to moisture or humidity. Polymers for microelectronic applications desirably contain low levels (generally less than 1 ppm, preferably less than 10 ppb) of ionic impurities, particularly for dielectric interlayers.

The materials, precursors and layers described herein can be and in many ways are designed to be solvated or dissolved in any suitable solvent, so long as the resulting solutions can be applied to a substrate, a surface, a wafer or layered material. Typical solvents are also those solvents that are able to solvate the monomers, isomeric monomer mixtures and polymers. Contemplated solvents include any suitable pure or mixture of organic or inorganic molecules that are volatilized at a desired temperature, such as the critical temperature, or that can facilitate any of the above-mentioned design goals or needs. The solvent may also comprise any suitable single polar and non-polar compounds or mixture thereof. As used herein, the term "polar" means that characteristic of a molecule or compound that creates an unequal charge, partial charge or spontaneous charge distribution at one point of or along the molecule or compound. As used herein, the term "non-polar" means that characteristic of a molecule or compound that creates an equal charge, partial charge or spontaneous charge distribution at one point of or along the molecule or compound. In some contemplated embodiments, the solvent or solvent mixture (comprising at least two solvents) comprises those solvents that are considered part of the hydrocarbon family of solvents. Hydrocarbon solvents are those solvents that comprise carbon and hydrogen. It should be understood that a majority of hydrocarbon solvents are non-polar; however, there are a few hydrocarbon solvents that could be considered polar. Hydrocarbon solvents are generally broken down into three classes: aliphatic, cyclic and aromatic. Aliphatic hydrocarbon solvents may comprise both straight-chain compounds and compounds that are branched and possibly crosslinked, however, aliphatic hydrocarbon solvents are not considered cyclic. Cyclic hydrocarbon solvents are those solvents that comprise at least three carbon atoms oriented in a ring structure with properties similar to aliphatic hydrocarbon solvents. Aromatic hydrocarbon solvents are those solvents that comprise generally three or more unsaturated bonds with a single ring or multiple rings attached by a common bond and/or multiple rings fused together. Contemplated hydrocarbon solvents include toluene, xylene, p-xylene, m-xylene, mesitylene, solvent naphtha H, solvent naphtha A, alkanes, such as pentane, hexane, isohexane, heptane, nonane, octane, dodecane, 2-methylbutane, hexadecane, tridecane, pentadecane, cyclopentane, 2,2,4-trimethylpentane, petroleum ethers, halogenated hydrocarbons, such as chlorinated hydrocarbons, nitrated hydrocarbons, benzene, 1,2-dimethylbenzene, 1,2,4-trimethylbenzene, mineral spirits, kerosene, isobutylbenzene, methylnaphthalene, ethyltoluene, ligroine. Particularly contemplated solvents include, but are not limited to, pentane, hexane, heptane, cyclohexane, benzene, toluene, xylene and mixtures or combinations thereof.

In other contemplated embodiments, the solvent or solvent mixture may comprise those solvents that are not considered part of the hydrocarbon solvent family of compounds, such as ketones, such as acetone, 3-pentanone, diethyl ketone, methyl ethyl ketone and the like, alcohols, ketones, esters, ethers and amines. In yet other contemplated embodiments, the solvent or solvent mixture may comprise a combination of any of the solvents mentioned herein. In some embodiments, the solvent comprises water, ethanol, propanol, acetone, ethylene oxide, benzene, toluene, ethers, cyclohexanone, butyrolactone, methylethylketone, and anisole.

It is still further contemplated that alternative low dielectric constant material may also comprise additional components. For example, where the low dielectric constant material is exposed to mechanical stress, softeners or other protective agents may be added. In other cases where the dielectric material is placed on a smooth surface, adhesion promoters may advantageously employed. In still other cases, the addition of detergents or antifoam agents may be desirable. In general, a precursor in the form of, e.g., a spin-on-glass composition that includes one or more removable solvents, is applied to a substrate, and then polymerized and subjected to solvent removal in such a way as to form a dielectric film comprising nanometer-scale pores.

When forming such nanoporous films, e.g., wherein the precursor is applied to a substrate by spin-coating, the film coating is typically catalyzed with an acid or base catalyst and water to cause polymerization/gelation ("aging") during an initial heating step. The film is then cured, e.g., by subjecting the film to one or more higher temperature heating steps to, inter alia, remove any remaining solvent and complete the polymerization process, as needed. Other curing methods include subjecting the film to radiant energy, e.g., ultraviolet, electron beam, microwave energy, and the like.

Co-owned U.S. Pat. Nos. 6,204,202 and 6,413,882, incorporated by reference herein, provide silicon-based precursor compositions and methods for forming nanoporous silica dielectric films by degrading or vaporizing one or more polymers or oligomers present in the precursor composition. Co-owned U.S. Pat. No. 6,495,479, provides silicon-based precursor compositions and methods for forming nanoporous silica dielectric films by degrading or vaporizing one or more compounds or polymers present in the precursor composition. U.S. Pat. No. 5,895,263 describes forming a nanoporous silica dielectric film on a substrate, e.g., a wafer, by applying a composition comprising decomposable polymer and organic polysilica i.e., including condensed or polymerized silicon polymer, heating the composition to further condense the polysilica, and decomposing the decomposable polymer to form a porous dielectric layer.

Processes for application of precursor to a substrate, aging, curing, planarization, and rendering the film(s) hydrophobic are described, for example, by co-owned U.S. Pat. Nos. 6,589,889 and 6,037,275, among others. Substrates and wafers contemplated herein may comprise any desirable substantially solid material. Particularly desirable substrate layers would comprise films, glass, ceramic, plastic, metal or coated metal, or composite material. In preferred embodiments, the substrate comprises a silicon or germanium arsenide die or wafer surface, a packaging surface such as found in a copper, silver, nickel or gold plated leadframe, a copper surface such as found in a circuit board or package interconnect trace, a via-wall or stiffener interface ("copper" includes considerations of bare copper and it's oxides), a polymer-based packaging or board interface such as found in a polyimide-based flex package, lead or other metal alloy solder ball surface, glass and polymers such as polyimide. The "substrate" may even be defined as another polymer chain when considering cohesive interfaces. In more preferred embodiments, the substrate comprises a material common in the packaging and circuit board industries such as silicon, copper, glass, and another polymer.

Subsequent semiconductor manufacturing processes such as deposition of cap film by PECVD techniques, and via and trench formation by patterning by means of etching and ashing, atomic layer deposition, physical vapor deposition, and a chemical vapor deposition treatment tend to remove carbon containing moieties which are hydrophobic groups from the organosilicate glass dielectric films and replace them with silanol groups. Undesirable properties result when the organosilicate glass dielectric films contain silanol groups. Silanols, and the water that they can adsorb from the air are highly polarizable in an electric field, and thus will raise the dielectric constant of the film, and will lower resistance to wet cleaning chemistries and increase volatile evolution. Also, when the trenches and vias are filled with a metal and subjected to an annealing treatment, metal shrinkage induces a stress on the via and trench walls and cause undesirable voids to form inside the dielectric material between the vias and trenches.

In order to remedy this problem, the organosilicate glass dielectric films are made substantially free of silanols and water by treatment with a toughening agent to restore carbon containing moieties and increase the hydrophobicity of the organosilicate glass dielectric film. This makes the film resistant to stresses on the via and trench walls, such as induced by metal shrinkage during annealing, stress from other dielectric layers, and stress during packaging, thus deters undesirable voids from forming inside the dielectric material between the vias and trenches.

Etching and plasma remove hydrophobic functional groups. Damage to organosilicate glass dielectric films during semiconductor manufacturing processes results from the application of aggressive plasmas and/or etching reagents to etch trenches and vias into dielectric films. Plasmas are also used to remove photoresist films during fabrication of semiconductor devices. The plasmas used are typically composed of the elements oxygen, fluorine, hydrogen, carbon, argon, helium or nitrogen (in the form of free atoms, compounds, ions and/or radicals).

Dielectric films which are exposed to these plasmas during trench, via, etch and/or photoresist removal are easily degraded or damaged. Porous dielectric films have a very high surface area and are therefore particularly vulnerable to plasmas damage. In particular, silica based dielectric films which have organic content (such as methyl groups bonded to Si atoms) are readily degraded by oxygen plasmas. The organic group is oxidized into $CO_2$ and a silanol or Si—OH group remains on the dielectric surface where the organic group formerly resided. Porous and non-porous low dielectric constant silica films depend on such organic groups (on surfaces) to remain hydrophobic. Loss of the hydrophobicity makes the dielectric constant rise (the low dielectric constant of such films is the key desired property of such materials).

Wet chemical treatments are also used in IC production for the purpose of removing residues leftover after trench or via etching. The chemicals used are often so aggressive they will attack and remove organic groups in silica based dielectric films, especially porous silica films. Again, this damage will cause the films to lose their hydrophobicity. Wet chemical etchants include, for example, amides, such as N-methylpyrrolidinone, dimethylformamide, dimethylacetamide; alcohols such as ethanol and 2-propanol; alcoholamines such as ethanolamine; amines such as triethylamine; diamines such as ethylenediamine and N,N-diethylethylenediamine; triamines such as diethylenetriamine, diamine acids such as ethylenediaminetetracetic acid "EDTA"; organic acids such as acetic acid and formic acid; the ammonium salts of organic acids such as tetramethylammonium acetate; inorganic acids such as sulfuric acid, phosphoric acid, hydrofluoric acid; fluoride salts such as ammonium fluoride; and bases such as ammonium hydroxide and tetramethyl ammonium hydroxide; and hydroxylamine; commercial formulations developed for post etch wet cleaning such as EKC 505, 525, 450, 265, 270, and 630 (EKC Corp., Hayward Calif.), and ACT-CMI and ACT-690 (Ashland Chemical, Hayward, Calif.) to name but a few art-known etchants. Ashing agents include plasmas derived from hydrogen, nitrogen, helium, argon, oxygen, and mixtures derived therefrom, and the like.

In order to solve the above mentioned problems the invention provides methods of imparting hydrophobic properties to organosilicate glass dielectric films present on a substrate during the process of fabricating a semiconductor or IC device.

The methods of the invention include the steps of contacting the organosilicate glass dielectric film, after being subjected to at least one etchant or ashing reagent, but before said metal has been subjected to an annealing treatment, with a toughening agent composition at a concentration and for a time period effective to restore at least some of the carbon containing moieties to the organosilicate glass dielectric film and increase the hydrophobicity of the organosilicate glass dielectric film; and (b) removing unreacted toughening agent composition, reaction products and mixtures thereof. The toughening agent composition includes at least one toughening agent, i.e., a compound or charged derivative thereof, suitable for removing silanol moieties from the damaged silica dielectric film. Optionally, the etchant-damaged silica dielectric film is then subjected to wet cleaning step.

The overall toughening agent composition comprises a component capable of alkylating or arylating silanol moieties of the organosilicate glass dielectric film via silylation, and an activating agent selected from the group consisting of an amine, an onium compound and an alkali metal hydroxide.

A suitable toughening agent composition includes one or more toughening agents able to remove silanol groups from the surface of an etched and/or ashed organosilicate glass dielectric film that it is desired to render hydrophobic. These may be silane, silazane, silanols, or carboxysilyl. For example, a toughening agent is a compound having a formula selected from the group consisting of Formulas I (1-13): (1) [—SiR$_2$NR'—]n where n>2 and may be cyclic; (2) R$_3$SiNR'SiR$_3$, (3) (R$_3$Si)$_3$N; (4) R$_3$SiNR'$_2$; (5) R$_2$Si(NR')$_2$; (6) RSi(NR')$_3$; (7) R$_x$SiCl$_y$, (8) R$_x$Si(OH)$_y$, (9) R$_3$SiOSiR'$_3$, (10) R$_x$Si(OR')$_y$, (11) R$_x$Si(OCOR')$_y$, (12) R$_x$SiH$_y$; (13) R$_x$Si[OC(R')=R"]$_{4-x}$ and combinations thereof, wherein x is an integer ranging from 1 to 3, y is an integer ranging from 1 to 3 such that y=4-x; each R is an independently selected from hydrogen and a hydrophobic organic moiety. The R groups are preferably independently selected from the group of organic moieties consisting of alkyl, aryl and combinations thereof. The R' group may be H, alkyl, aryl, or carbonyl such as COR, CONR, CO$_2$R. The R" may be alkyl or carbonyl such as COR, CONR, CO$_2$R For all toughening agents, the reactive silyl group must contain a hydrolyzable leaving group such as but not limited to —Cl, —Br, —I, —OR, —NR$_x$ (where x=1-2), —OCOR, —OCO$_2$R, —NRCOR, —NRCO$_2$R, —NRCONR, —SR, —SO$_2$R. For reaction of the toughening agent, hydrolysis may occur spontaneously with moisture present during the toughening agent application and process, or pre-hydrolysis may be forced during the formulation process.

The alkyl moiety is either functionalized or non-functionalized and is derived from groups of straight alkyl, branched alkyl, cyclic alkyl and combinations thereof, and wherein said alkyl moiety ranges in size from $C_1$ to about $C_{18}$. The functionalization may be a carbonyl, a halide, an amine, an alcohol, an ether, a sulfonyl or sulfide. The aryl moiety is substituted or unsubstituted and ranges in size from $C_5$ to about $C_{18}$. Preferably the toughening agent is an acetoxysilane, or, for example, a monomer compound such as acetoxysilane, diacetoxysilane, triacetoxysilane, acetoxytrimethylsilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, hexamethylcyclotrisilazane, bis(dimethylamino)dimethylsilane, bis(diethylamino)dimethylsialne, tris(dimethylamino)methylsilane, tris(dimethylamino)phenylsilane, tris(dimethylamino)silane, dimethylsilyldiformamide, dimethylsilyldiacetamide, dimethylsilyldiisocyante, trimethylsilyltriisocyanate, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, and combinations thereof. In one noteworthy embodiment, the toughening agent is methyltriacetoxysilane. In a preferred embodiment the toughening agent is dimethyldiacetoxysilane.

Additional toughening agents include multifunctional surface modification agents as described in detail in U.S. Pat. No. 6,208,014, incorporated by reference herein, as described above. Such multifunctional surface modification agents can be applied in either vapor or liquid form, optionally with or without co-solvents.

Suitable co-solvents include, e.g., ketones, such as acetone, diisopropylketone, 2-heptanone, 3-pentanone, and others, as described in detail in co-owned U.S. Pat. No. 6,395,651, the disclosure of which is incorporated by reference herein.

For example, as described in detail in U.S. Pat. No. 6,208,014, certain preferred surface modification agents will have two or more functional groups and react with surface silanol functional groups while minimizing mass present outside the structural framework of the film, and include, e.g., surface silanols may condense with suitable silanols such as $R_xSi(OH_2)_{4-x}$ Wherein x=1-3, and each R is independently selected moieties, such as H and/or an organic moiety such as an alkyl, aryl or derivatives of these. When R is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When R is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is a heteroaryl.

In another embodiment, alkoxy silanes may be used as the toughening agent, e.g. suitable alkoxy silanes such as $R_xSi(OR')_{4-x}$ wherein R are independently selected moieties, such as H and/or an organic moiety such as an alkyl, aryl or derivatives of these; R' are independently selected alkyl or aryl moieties. When R or R' is an alkyl, the alkyl moiety is optionally substituted or unsubstituted, and may be straight, branched or cyclic, and preferably ranges in size from $C_1$ to about $C_{18}$, or greater, and more preferably from $C_1$ to about $C_8$. When R or R' is aryl, the aryl moiety preferably consists of a single aromatic ring that is optionally substituted or unsubstituted, and ranges in size from $C_5$ to about $C_{18}$, or greater, and more preferably from $C_5$ to about $C_8$. In a further option, the aryl moiety is a heteroaryl. Thus, the R groups independently selected from H, methyl, ethyl, propyl, phenyl, and/or derivatives thereof, provided that at least one R is organic. In one embodiment, both R groups are methyl, and a tri-functional surface modification agent is methyltrimethoxysilane.

In another embodiment, a suitable silane according to the invention has the general formula of $R_xSi(NR_2)_{4-x}$ wherein X=1-3, R are independently H, alkyl and/or aryl. When any R are alkyl and/or aryl. In preferred embodiments, R is selected from H, $CH_3$, $C_6H_5$, and $R_2$ and $R_3$ are both $CH_3$. Thus tri-functional toughening agents include, e.g., tris(dimethylamino)methylsilane, tris(dimethylamino)phenylsilane, and/or tris(dimethylamino)silane. In addition, disubstituted silanes may be used such as hexamethylcyclotrisilazane, bisdimethylaminodimethylsilane, and bisdiethylaminodimethylsilane.

In yet another embodiment, a suitable silane according to the invention has the general formula of $R_xSi(ON=CR_2)_{4-x}$ or $R_xSi[OC(R')=R'']_{4-x}$ wherein x=1-3 and the R groups are independently H, alkyl and/or aryl, R' may be H, alkyl, aryl, alkoxy or aryloxy, and R'' may be alkyl or carbonyl. Thus modification agents include, e.g., methyltris(methylethylketoxime)silane or 2-trimethylsiloxypent-2-ene-4-one respectively.

In yet another embodiment, a suitable silane according to the invention has the general formula of $R_xSi(NCOR_2)_{4-x}$ or $R_xSi(NCO)_{4-x}$ wherein x=1-3, R groups are independently H, alkyl and/or aryl. Thus surface modification agents include, e.g., dimethylsilyldiformamide, dimethylsilyldiacetamide, dimethylsilyldiisocyante, trimethylsilyltriisocyante.

In yet a further embodiment, a suitable silane according to the invention has the general formula of $R_xSiCl_{4-x}$ wherein x=1-3, is H, alkyl or aryl. In one preferred embodiment, $R_x$ is $CH_3$. Thus tri-functional surface modification agents include, e.g., methyltrichlorosilane.

In a more preferred embodiment, the toughening agent includes one or more organoacetoxysilanes which have the following general formula, $(R_1)_xSi(OCOR_2)_y$ Preferably, x is an integer ranging in value from 1 to 2, and x and y can be the same or different and y is an integer ranging from about 2 to about 3, or greater.

Useful organoacetoxysilanes, including multifunctional alkylacetoxysilane and/or arylacetoxysilane compounds, include, simply by way of example and without limitation, methyltriacetoxysilane ("MTAS"), dimethyldiacetoxysilane (DMDAS), phenyltriacetoxysilane and diphenyldiacetoxysilane and combinations thereof.

The component capable of alkylating or arylating silanol moieties of the organosilicate glass dielectric film via silylation is usually present in the toughening agent composition in an amount of from about 0.1 weight percent to about 100 weight percent, more usually from about 1 weight percent to about 50 weight percent, and most usually from about 3 weight percent to about 30 weight percent.

The toughening agent composition then contains an activating agent selected from the group consisting of an amine, an onium compound and an alkali metal hydroxide. Useful activating agents include ammonium compounds, phosphonium compounds, sulfonium compounds and iodonium compounds. Included are activating agents which may be alkyl amines, aryl amines, alcohol amines and mixtures thereof which suitably have a boiling point of about 100° C. or higher, usually about 125° C. or higher and more usually about 150° C. or higher.

Useful amine activating agent include primary amines, secondary amines, tertiary amines, ammonia, and quaternary ammonium salts. Useful amines are monoethanolamine, diethanolamine, triethanolamine, monoisopropanolamine, tetraethylenepentamine, 2-(2-aminoethoxy)ethanol; 2-(2-aminoethylamino)ethanol and mixtures thereof.

In a desired embodiment of the invention the activating agent comprises tetramethylammonium acetate, tetrabutylammonium acetate or combinations thereof. Other activating agents include sodium hydroxide, potassium hydroxide, lithium hydroxide and ammonium hydroxide. The activating agent is usually present in the toughening agent composition in an amount of from about 0.0001 weight percent to about 10 weight percent, more usually from about 0.001 weight percent to about 1 weight percent, and most usually from about 0.01 weight percent to about 0.1 weight percent.

Optionally, the toughening agent composition includes a solvent composition capable of solubilizing with the component capable of alkylating or arylating silanol moieties of the organosilicate glass dielectric film via silylation, and the activating agent. Suitable solvents compositions non-exclusively include, for example, ketones, ethers, esters, hydrocarbons, alcohols, carboxylic acids, amides, and combinations thereof. Useful solvents non-exclusively include 3-pentanone, 2-heptanone, gammabutyrolactone, propylene glycol methyl ether acetate, acetic acid, and combinations thereof. The solvent, when employed, is usually present in the toughening agent composition in an amount of from about 0 weight percent to about 99.9 weight percent, more usually from about 50 weight percent to about 99 weight percent, and most usually from about 70 weight percent to about 97 weight percent. In another embodiment of the invention, the toughening agent composition includes a supercritical solvent, such as supercritical carbon dioxide.

Optionally, the toughening agent composition includes a corrosion inhibitor, such as a corrosion inhibitor which chelates with copper. Such may include benzotriazole, tolyltriazole, and combinations thereof. The corrosion inhibitor, when employed, is usually present in the toughening agent composition in an amount of from about 0.001 weight percent to about 10 weight percent, more usually from about 0.01 weight percent to about 5 weight percent, and most usually from about 0.2 weight percent to about 1 weight percent.

The toughening agent composition is formed by blending the selected components into a mixture. The toughening agent composition contacts the damaged silica dielectric film as a liquid, vapor or gas, and/or plasma. If in the form of a plasma, the plasma can be derived from a silane compound, a hydrocarbon, an aldehyde, an ester, an ether, and/or combinations thereof. The terms, "agent" or "agents" herein should be considered to be synonymous with the terms, "reagent" or "reagents," unless otherwise indicated. Optionally the treatment further comprises the subsequent step of removing unreacted toughening agent composition, reaction products and mixtures thereof and/or the subsequent step of heating the increased hydrophobicity organosilicate glass dielectric film.

In yet another embodiment, a wet clean using chemicals such as AP395 or dilute HF is performed after the bake step in the above-mentioned embodiments. The wet clean is useful to remove any resist residues remaining after the ash. Untreated low-k dielectric materials after etch and ash are prone to attack by the wet clean agents. The toughening agent treatment significantly improves resistance of the low-k dielectric to attack by wet clean.

Depending on the process flow, a copper surface may be exposed during the toughening agent treatment, especially at the bottom of via. In addition to removing native oxide from copper surface, the wet clean can also remove any reaction product between toughening agent and an exposed copper surface. Specifically, a wet clean using AP395 can clean a copper (or any suitable metal or metal alloy) surface that is previously exposed to a toughening agent treatment using DMDAS.

As used herein, the term "metal" means those elements that are in the d-block and f-block of the Periodic Chart of the Elements, along with those elements that have metal-like properties, such as silicon and germanium. As used herein, the phrase "d-block" means those elements that have electrons filling the 3d, 4d, 5d, and 6d orbitals surrounding the nucleus of the element. As used herein, the phrase "f-block" means those elements that have electrons filling the 4f and 5f orbitals surrounding the nucleus of the element, including the lanthanides and the actinides. Preferred metals include indium, silver, copper, aluminum, tin, bismuth, gallium and alloys thereof, silver coated copper, and silver coated aluminum. The term "metal" also includes alloys, metal/metal composites, metal ceramic composites, metal polymer composites, as well as other metal composites.

In yet another embodiment, the wet clean can be performed before the bake process in the first contemplated embodiment. The high temperature bake step is performed after the wet clean. An advantage of this method can be that the wet clean can remove excess toughening agent and any reaction product with any exposed copper surface, before it is "hardened" by the bake process. This can result in lower volatile components in the dielectric material and a cleaner copper surface. Both can result in an improved long term reliability.

In another contemplated embodiment, an additional dehydration bake at 100-400° C. from 1 min to 120 min is performed before the toughening agent (TA) treatment. The dehydration bake removes any moisture adsorbed in the damaged low-k dielectric. Removal of moisture from the dielectric prior to toughening agent treatment renders the treatment more effective.

In an alternative embodiment, the toughening agent composition is provided by exposing the etchant-damaged organosilicate glass dielectric film to a plasma which is derived from any of the above mentioned toughening agent. In a typical procedure, the organosilicate glass dielectric film is placed in a plasma generating chamber, such as a plasma enhanced chemical vapor deposition (PECVD) system; the vapor of a toughening agent composition and argon vapor are passed through the plasma generating chamber; then an RF energy source is activated to create a plasma; the argon gas is included to help promote the formation of plasma. The plasma is composed of ionic fragments derived from the toughening agent composition; for example, the ion fragment $CH_3Si^+$ is generated from methylsilane ($CH_3SiH_3$). This fragment reacts with silanol groups to form hydrophobic $Si-CH_3$ moieties. Any of the above mentioned toughening agent compositions can be used for this plasma induced surface treatment.

Other suitable toughening agent compositions for a plasma induced surface treatment include $C_1$-$C_{12}$ alkyl and aromatic hydrocarbons. The most preferred hydrocarbon is methane. Other reagents for plasma induced toughening agent compositions include aldehydes, esters, acid chlorides, and ethers. Suitable aldehydes include acetaldehyde and benzaldehyde; suitable esters include ethyl acetate and methyl benzoate; suitable acid chlorides include acetyl chloride and benzyl chloride; and suitable ethers include diethyl ether and anisole. A wide variety of single wafer or multiple wafer (batch) plasma systems can be used for this process; these systems include so called downstream ashers, such as the Gasonics L3510 photoresist asher, PECVD dielectric deposition systems such as the Applied Materials P5000, or reactive ion etch ("RIE") systems. Broadly, the conditions for the plasma process are within the following ranges: chamber temperature, 20 C to 450° C.; RF power, 50 W to 1000 W; chamber pressure, 0.05 to 100 torr; plasma treatment time, 5 seconds to 5 minutes; and surface modification flow rate, 100-2000 sccm; inert gas flow rate (typically argon), 100-2000 sccm.

The artisan will appreciate that the invention is also contemplated to encompass methods of imparting a hydrophobic surface to silica dielectric films, porous and/or nonporous, whether damaged or not, by application of the above-described plasma surface treatments. Microelectronic devices, such as semiconductor devices or ICs manufactured using these methods are also a part of the present invention. A microelectronic device may be produced by a process comprising: a) applying an organosilicate glass dielectric film onto a substrate; b) forming a pattern of vias and trenches in the organosilicate glass dielectric film, and subjecting the organosilicate glass dielectric film to at least one treatment which removes at least a portion of previously existing carbon containing moieties and reduces hydrophobicity of said organosilicate glass dielectric film; c) contacting the organosilicate glass dielectric film with a toughening agent composition at a concentration and for a time period effective to increase the hydrophobicity of the organosilicate glass dielectric film, wherein the toughening agent composition comprises a component capable of alkylating or arylating silanol moieties of the organosilicate glass dielectric film via silylation, and an activating agent selected from the group consisting of an amine, an onium compound and an alkali metal hydroxide; optionally baking at from about 80° C. to about 500° C. for about 10 seconds or more. In one embodiment, baking may be done by heating at temperatures of from about 90° C. to about 450° C. In another embodiment, heating may be done at temperatures of from about 100° C. to about 400° C., in yet another embodiment, heating may be done at temperatures of from about 125° C. to about 350° C. Such heating may be done for from about 10 seconds or more, preferably for from about 10 seconds to about 60 minutes. The next step is d) filling the vias and trenches with a metal by any method known in the art; and then e) optionally subjecting the metal to an annealing treatment. In one embodiment, annealing may be done by heating the device at temperatures of from about 150° C. to about 350° C. In another embodiment, annealing may be done by heating the device at temperatures of from about 200° C. to about 250° C., Annealing may be done for from about 10 seconds to about 60 minutes.

The microelectronic devices, dielectric layers and materials may be utilized or incorporated into any suitable electronic component. Electronic components, as contemplated herein, are generally thought to comprise any dielectric component or layered dielectric component that can be utilized in an electronic-based product. Contemplated electronic components comprise circuit boards, chip packaging, dielectric components of circuit boards, printed-wiring boards, and other components of circuit boards, such as capacitors, inductors, and resistors.

Electronic-based products can be "finished" in the sense that they are ready to be used in industry or by other consumers. Examples of finished consumer products are a television, a computer, a cell phone, a pager, a palm-type organizer, a portable radio, a car stereo, and a remote control. Also contemplated are "intermediate" products such as circuit boards, chip packaging, and keyboards that are potentially utilized in finished products.

Electronic products may also comprise a prototype component, at any stage of development from conceptual model to final scale-up mock-up. A prototype may or may not contain all of the actual components intended in a finished product, and a prototype may have some components that are constructed out of composite material in order to negate their initial effects on other components while being initially tested. Electronic products and components may comprise layered materials, layered components, and components that are laminated in preparation for use in the component or product.

The following non-limiting examples serve to illustrate the invention.

Example 1

A precursor was made by adding 9.72 g of dimethyldiacetoxysilane (Gelest, Tullytone, Pa. 19007), 26.0 g of 3-pentanone (Ultra Pure Solutions Inc., Castroville, Calif. 85012), 280 ppm of tetramethylammonium acetate (Aldrich Chemical Company, Milwaukee, Wis. 53201), together in a 60 ml particle free high density polyethylene bottle. The solution was mixed vigorously for one minute. After mixing the diluted precursor was hand filtered to 0.2 μm using a teflon filter. Approximately 2.0-3.0 ml of the precursor was deposited onto an 8" etched ($C_4F_8$; 20 s.) & ashed (plasma $O_2$; 20 s.) carbon depleted porous dielectric film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post Toughening Agent ILD |
|---|---|---|---|
| Dielectric Constant (k) | 2.2 | 3.1 | 2.3 |
| FTIR (CH/SiO ratio) | 0.0085 | 0.0048 | 0.0083 |
| $H_2O$ Contact Angle (°) | 78 | <20 | 101 |

Example 2

A precursor was made by adding 9.72 g of dimethyldiacetoxysilane (Gelest, Tullytone, Pa. 19007), 26.0 g of 2-heptanone (Ultra Pure Solutions Inc., Castroville, Calif. 85012), 280 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 μm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post Toughening Agent ILD |
|---|---|---|---|
| Dielectric Constant (k) | 2.2 | 3.1 | 2.3 |
| FTIR (CH/SiO ratio) | 0.0085 | 0.0048 | 0.0073 |

Example 3

A precursor was made by adding 9.72 g of dimethyldiacetoxysilane (Gelest, Tullytone, Pa. 19007), 26.0 g of propylene glycol methyl ether acetate (General Chemical, Hollister, Calif. 95023), 280 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 µm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post Toughening Agent ILD |
|---|---|---|---|
| Dielectric Constant (k) | 2.2 | 3.1 | 2.3 |
| FTIR (CH/SiO ratio) | 0.0085 | 0.0048 | 0.0078 |

Example 4

The precursor was made by adding 9.72 g of dimethyldiacetoxysilane (Gelest, Tullytone, Pa. 19007), 26.0 g of 2-heptanone (Ultra Pure Solutions Inc., Castroville, Calif. 85012), 2800 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 µm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.08 | 2.17 |
| FTIR (CH/SiO ratio) | 0.0083 | 0.00482 | 0.0091 |

Example 5

The precursor was made by adding 2.65 g of dimethyldiacetoxysilane (Gelest, Tullytone, Pa. 19007), 26.0 g of 2-heptanone (Ultra Pure Solutions Inc., Castroville, Calif. 85012), 2800 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 µm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.04 | 2.22 |
| FTIR (CH/SiO ratio) | 0.0099 | 0.0066 | 0.0010 |

Example 6

The precursor was made by adding 2.65 g of dimethyldiacetoxysilane (Gelest, Tullytone, Pa. 19007), 26.0 g of 2-heptanone (Ultra Pure Solutions Inc., Castroville, Calif. 85012), 4200 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 µm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.04 | 2.30 |
| FTIR (CH/SiO ratio) | 0.0099 | 0.0066 | 0.0105 |

Example 7

The precursor was made by adding 0.810 g of dimethyldiacetoxysilane (Gelest, Tullytone, Pa. 19007), 26.0 g of 2-heptanone (Ultra Pure Solutions Inc., Castroville, Calif. 85012), 4200 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 µm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.04 | 2.40 |
| FTIR (CH/SiO ratio) | 0.0089 | 0.0052 | 0.0071 |

Example 8

The precursor was made by adding 9.72 g of dimethyldiacetoxysilane (Gelest, Tullytone, Pa. 19007), 26.0 g of 2-heptanone (Ultra Pure Solutions Inc., Castroville, Calif. 85012), 4200 ppm of tetramethylammonium acetate (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 μm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.04 | 2.17 |
| FTIR (CH/SiO ratio) | 0.0099 | 0.0066 | 0.0112 |

Example 9

Two precursors were made to compare the effects of toughening agent with and without tetramethylammonium acetate. One precursor was made by adding 9.72 g of dimethyldiacetoxysilane (Gelest, Tullytone, Pa. 19007), 26.0 g of 3-pentanone (Ultra Pure Solutions Inc., Castroville, Calif. 85012), 280 ppm of tetramethylammonium acetate (TMAA) (Aldrich Chemical Company, Milwaukee, Wis. 53201), together in a 60 ml particle free high density polyethylene bottle. The solution was mixed vigorously for one minute. After mixing, the diluted precursor was hand filtered to 0.2 μm using a teflon filter. The second precursor was made by adding 9.72 g of dimethyldiacetoxysilane (Gelest, Tullytone, Pa. 19007), and 26.0 g of 2-heptanone (Ultra Pure Solutions Inc., Castroville, Calif. 85012), together in a 60 ml particle free high density polyethylene bottle. The solution was mixed vigorously for one minute. After mixing, the diluted precursor was hand filtered to 0.2 μm using a teflon filter. Approximately 2.0-3.0 mls of each precursor were deposited onto separate 8" etched ($C_4F_8$; 20 s.) & ashed (plasma $O_2$; 20 s.) carbon depleted porous films (~4000 Å thick). After deposition, each film was spun at 2500 rpm for 30 seconds to remove all volatile species. Each films were heated at elevated temperatures for 1 min. each at 125° C., 200° C. and 350° C. in air. The following results were observed:

| Measurement | Pre-Etch & Ash ILD | Post-Etch & Ash ILD | Post TA with TMAA ILD | Post TA w/out TMAA ILD |
|---|---|---|---|---|
| Dielectric Constant (k) | 2.2 | 3.15 | 2.35 | 2.98 |
| FTIR (CH/SiO ratio) | 0.0085 | 0.00510 | 0.0081 | 0.0059 |

Example 10

The precursor was made by adding 3.25 g of hexamethylcyclotrisilazane (Gelest, Tullytone, Pa. 19007) and 25.0 g of 2-heptanone (Ultra Pure Solutions Inc., Castroville, Calif. 85012) together in a 60 ml particle free high-density polyethylene bottle. The solution was mixed vigorously for one minute. After mixing, the diluted precursor was hand filtered to 0.2 μm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.35 | 2.66 |
| FTIR (CH/SiO ratio) | 0.0085 | 0.0046 | 0.0078 |

Example 11

The precursor was made by adding 6.5 g of bis(dimethylamino)dimethylsilane (Gelest, Tullytone, Pa. 19007) and 22.0 g of 2-heptanone (Ultra Pure Solutions Inc., Castroville, Calif. 85012) together in a 60 ml particle free high-density polyethylene bottle. The solution was mixed vigorously for one minute. After mixing, the diluted precursor was hand filtered to 0.2 μm using a teflon filter. Approximately 2.0-3.0 ml of the precursor was deposited onto an 8" etched ($C_4F_8$; 20 s.) & ashed (plasma $O_2$; 20 s.) carbon depleted porous film (~4000 Å thick). After deposition, the film was spun at 2500 rpm for 30 seconds to remove all volatile species. The films were heated at elevated temperatures for 1 min. each at 125° C., 200° C. and 350° C. in air. The following results were observed:

| Measurement | Pre-Etch & Ash ILD | Post-Etch & Ash ILD | Post TA ILD |
|---|---|---|---|
| Dielectric Constant (k) | 2.2 | 3.35 | 2.6 |
| FTIR (CH/SiO ratio) | 0.0083 | 0.0045 | 0.0087 |

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A toughening agent composition for increasing the hydrophobicity and/or increasing the mechanical strength properties of an organosilicate glass dielectric film when applied to said film, which comprises a component capable of alkylating or arylating silanol moieties of the organosilicate glass dielectric film via silylation, and an activating agent comprising a primary amine, a secondary amine, a tertiary amine, a quaternary ammonium salt, an onium compound or an alkali metal hydroxide.

2. The toughening agent composition of claim 1 wherein the activating agent comprises an ammonium compound, a phosphonium compound, a sulfonium compound or an iodonium compound.

3. The toughening agent composition of claim 1 wherein the activating agent comprises an alkyl amine, an aryl amine or an alcohol amine.

4. The toughening agent composition of claim 1 wherein the activating agent comprises tetramethylammonium acetate, tetrabutylammonium acetate or combinations thereof.

5. The toughening agent composition of claim 1 wherein the activating agent comprises sodium hydroxide, potassium hydroxide, lithium hydroxide or ammonium hydroxide.

6. The toughening agent composition of claim 1 wherein the component capable of alkylating or arylating silanol moieties of the organosilicate glass dielectric film via silylation comprises at least one compound having a formula [—$SiR_2NR'$—]n where n>2 and may be cyclic; $R_3SiNR'SiR_3$, $(R_3Si)_3N$; $R_3SiNR'_2$; $R_2Si(NR')_2$; $RSi(NR')_3$; $R_xSiCl_y$, $R_xSi(OH)_y$; $R_3SiOSiR'_3$; $R_xSi(OR')_y$; $R_xSi(OCOR')_y$; $R_xSiH_y$; $R_xSi[OC(R')=R'']_{4-x}$ or combinations thereof, wherein x is an integer ranging from 1 to 3, y is an integer ranging from 1 to 3 such that y=4-x, each R is an independently selected from hydrogen and a hydrophobic organic moiety;

R' is hydrogen, or an organic moiety, and

R" is an alkyl or carbonyl group.

7. The toughening agent composition of claim 1 wherein the component capable of alkylating or arylating silanol moieties of the organosilicate glass dielectric film via silylation comprises at least one compound of acetoxytrimethylsilane, acetoxysilane, diacetoxysilane, triacetoxysilane, diacetoxydimethylsilane, methyltriacetoxysilane, phenyltriacetoxysilane, diphenyldiacetoxysilane, methyltriethoxysilane, dimethyldiethoxysilane, trimethylethoxysilane, methyltrimethoxysilane, dimethyldimethoxysilane, trimethylmethoxysilane, methyltrichlorosilane, dimethyldichlorosilane, trimethylchlorsilane, methylsilane, dimethylsilane, trimethylsilane, hexamethyldisilazane, 2-trimethylsiloxypent-2-ene-4-one, n-(trimethylsilyl)acetamide, 2-(trimethylsilyl) acetic acid, n-(trimethylsilyl)imidazole, trimethylsilylpropiolate, trimethylsilyl(trimethylsiloxy)-acetate, nonamethyltrisilazane, hexamethyldisiloxane, trimethylsilanol, triethylsilanol, triphenylsilanol, t-butyldimethylsilanol, diphenylsilanediol, trimethoxysilane, triethoxysilane, trichlorosilane, hexamethylcyclotrisilazane, bisdimethylaminodimethylsilane, bisdiethylaminodimethylsilane, tris (dimethylamino)methylsilane, tris(dimethylamino)phenylsilane, tris(dimethylamino)silane, dimethylsilyldiformamide, dimethylsilyldiacetamide, dimethylsilyldiisocyante, trimethylsilyltriisocyanate and combinations thereof.

8. The toughening agent composition of claim 1 wherein the component capable of alkylating or arylating silanol moieties of the organosilicate glass dielectric film via silylation comprises dimethyldiacetoxysilane.

9. A toughening agent composition for increasing the hydrophobicity and/or increasing the mechanical strength properties of an organosilicate glass dielectric film when applied to said film, which comprises a component capable of alkylating or arylating silanol moieties of the organosilicate glass dielectric film via silylation, and an activating agent comprising an amine, an onium compound or an alkali metal hydroxide; and further comprising a corrosion inhibitor.

10. The toughening agent composition of claim 9 wherein said corrosion inhibitor chelates with copper.

11. The toughening agent composition of claim 9 wherein said corrosion inhibitor comprises benzotriazole, tolyltriazole, or a combination thereof.

12. A toughening agent composition for increasing the hydrophobicity and/or increasing the mechanical strength properties of an organosilicate glass dielectric film when applied to said film, which comprises a component capable of alkylating or arylating silanol moieties of the organosilicate glass dielectric film via silylation, and an activating agent comprising an amine, an onium compound or an alkali metal hydroxide; and further comprising a solvent composition capable of solubilizing with the component capable of alkylating or arylating silanol moieties of the organosilicate glass dielectric film via silylation, and the activating agent.

13. The toughening agent composition of claim 12 wherein the solvent composition comprises ketones, ethers, esters, hydrocarbons, alcohols, carboxylic acids, amides, or a combination thereof.

14. The toughening agent composition of claim 12 wherein the solvent composition comprises 3-pentanone, 2-heptanone, gammabutyrolactone, propylene glycol methyl ether acetate, acetic acid, or a combination thereof.

15. The toughening agent composition of claim 1 wherein the component capable of alkylating or arylating silanol moieties of the organosilicate glass dielectric film via silylation comprises dimethyldiacetoxysilane; and the activating agent comprises tetramethylammonium acetate.

16. The toughening agent composition of claim 15 further comprising a solvent comprising 3-pentanone, 2-heptanone, gammabutyrolactone, propylene glycol methyl ether acetate, acetic acid, or combinations thereof.

17. The toughening agent composition of claim 15 further comprising a corrosion inhibitor comprising benzotriazole, tolyltriazole, or combinations thereof.

18. A method for deterring the formation of stress-induced voids in an organosilicate glass dielectric film on a substrate, which organosilicate glass dielectric film has been patterned to form vias and trenches therein, and which organosilicate glass dielectric film has been thereafter subjected to at least one treatment which removes at least a portion of previously existing carbon containing moieties and reduces hydrophobicity of said organosilicate glass dielectric film, and which vias and trenches have been thereafter filled with a metal, and which metal has optionally thereafter been subjected to an annealing treatment, the method comprising contacting the organosilicate glass dielectric film, after being subjected to at least one treatment which removes previously existing carbon containing moieties, but before said vias and trenches have been filled with a metal, with a toughening agent composition at a concentration and for a time period effective to restore at least some of the carbon containing moieties to the organosilicate glass dielectric film and increase the hydrophobicity of the organosilicate glass dielectric film wherein the toughening agent composition comprises a component capable of alkylating or arylating silanol moieties of the organosilicate glass dielectric film via silylation, and an activating agent comprising a primary amine, a secondary amine, a tertiary amine, a quaternary ammonium salt, an onium compound or an alkali metal hydroxide.

19. The method of claim 18 which further comprises the steps of:

a) applying an organosilicate glass dielectric film onto a substrate;

b) forming a pattern of vias and trenches in the organosilicate glass dielectric film, and subjecting the organosilicate glass dielectric film to at least one treatment which removes at least a portion of previously existing carbon containing moieties and reduces hydrophobicity of said organosilicate glass dielectric film;

c) contacting the organosilicate glass dielectric film with said toughening agent composition;

d) optionally baking at from about 80° C. to about 400° C. for about 10 seconds or more;

e) filling the vias and trenches with a metal; and f) optionally subjecting the metal to an annealing treatment.

20. The method of claim 19 further comprising the subsequent step of removing unreacted toughening agent composition, reaction products and mixtures thereof.

21. The method of claim 19 further comprising the subsequent step of heating the increased hydrophobicity organosilicate glass dielectric film.

22. The method of claim 19 wherein the organosilicate glass dielectric film is porous.

23. The method of claim 19 wherein the organosilicate glass dielectric film substantially non-porous.

24. The method of claim 19 wherein the toughening agent composition contacts the organosilicate glass dielectric film in a state comprising liquid, vapor, gas, or plasma.

25. The method of claim 19 wherein the toughening agent composition comprises a supercritical solvent.

26. The method of claim 19 wherein the treatment which removes at least a portion of previously existing carbon containing moieties and reduces hydrophobicity of said organosilicate glass dielectric film comprises at least one of an etchant treatment, an ashing treatment, a wet stripping treatment, a cleaning treatment, atomic layer deposition, physical vapor deposition, and a chemical vapor deposition treatment.

* * * * *